United States Patent [19]
Ishihara et al.

[11] Patent Number: 5,910,336
[45] Date of Patent: Jun. 8, 1999

[54] PROCESS FOR PRODUCING LIGHT-ABSORBING CHALCOPYRITE FILM

[75] Inventors: Hiroki Ishihara; Shinichi Nakagawa; Norio Mochizuki; Masaharu Ishida, all of Shizuoka, Japan

[73] Assignee: Yazaki Corporation, Tokyo, Japan

[21] Appl. No.: 09/052,163

[22] Filed: Mar. 31, 1998

[30] Foreign Application Priority Data

Mar. 31, 1997 [JP] Japan ..................................... 9-079793

[51] Int. Cl.$^6$ ....................................................... B05D 3/12
[52] U.S. Cl. ........................... 427/240; 427/76; 427/226; 427/229; 427/250; 427/255; 427/377; 427/380; 427/383.1; 427/430.1
[58] Field of Search ..................................... 427/226, 240, 427/430.1, 255, 229, 76, 250, 377, 380, 383.1

[56] References Cited

U.S. PATENT DOCUMENTS 4,242,374 12/1980 Sansregret ................................. 427/76

*Primary Examiner*—Janyce Bell
*Attorney, Agent, or Firm*—Sughrue, Mion, Zinn, Macpeak & Seas, PLLC

[57] ABSTRACT

An improved process for producing a light-absorbing chalcopyrite film is disclosed, which comprises the steps of: applying at least one solution containing at least either of (a) an organic compound of a metal in Group 1B of the periodic table and (b) an organic compound of a metal in Group 3B of the periodic table on a substrate at least once to thereby form a thin film containing the organic compound (a) and the organic compound (b); heating the thin film in a reducing or inert gas atmosphere to convert the thin film into a thin metal film comprising the Group 1B metal and the Group 3B metal; and heating the thin metal film in an atmosphere containing either an element in Group 6B of the periodic table or a compound thereof to thereby convert the thin metal film into a thin chalcopyrite film. This process eliminates the problem concerning the control of the composition and thickness of a light-absorbing chalcopyrite film, and is suitable for the mass production of homogeneous large light-absorbing plates for use in solar cells.

6 Claims, No Drawings

PROCESS FOR PRODUCING LIGHT-ABSORBING CHALCOPYRITE FILM

FIELD OF THE INVENTION

The present invention relates to a process for producing a light-absorbing chalcopyrite film for use as a semiconducting material for photo-electric conversion. More particularly, this invention relates to an improved process for producing a thin film compound semiconductor which comprises Group 1B, Group 3B, and Group 6B elements of the periodic table, e.g., a copper-indium-selenium compound, and is utilized especially as a light-absorbing layer in solar cells, etc.

BACKGROUND OF THE INVENTION

A solar cell is a device which converts light energy to electrical energy. It is usually fabricated by forming an electrode layer, an absorption layer comprising a photo-electric converting semiconductor, and a light-transmitting electrode layer in this order on an electrical insulating substrate. Although a thin layer of the copper-indium-selenium ternary alloy having an atomic ratio of 1/1/2 is thought to have the highest photo-electric conversion efficiency when used as the photo-electric converting semiconductor layer, it has not always been easy to control the thickness of the alloy layer while controlling the proportions of the three components.

For forming such a thin alloy layer, vapor deposition (see, for example, JP-A-1-231313) and sputtering have been widely used. (The term "JP-A" as used herein means an "unexamined published Japanese patent application".) However, since these are film-forming techniques in which the three ingredients, i.e., copper, indium, and selenium, are successively or simultaneously deposited in a vacuum chamber, these methods have drawbacks, for example, that a large-scale apparatus is necessary for obtaining a homogeneous film having a large area, that the control of the vacuum system in the apparatus requires much time, and that it is difficult to control the composition and thickness of the film to be formed. Those two film-forming techniques are hence thought to be costly in film production and unsuitable for mass production.

An electroplating method in which copper and indium or an alloy of these is deposited in thin film form was proposed as a substitute for the vapor deposition or the sputtering. Furthermore, an improved method as a modification of the above electroplating method has been proposed, in which a copper-indium alloy layer containing selenium particles dispersed therein is formed using a copper-indium alloy electrodeposition bath containing fine selenium particles suspended therein (see International Publication WO 92/05586). However, these techniques also have various difficulties in controlling the composition of the electrodeposit to be formed.

SUMMARY OF THE INVENTION

The present invention is intended to eliminate the problem in those prior art techniques that the control of the composition and thickness of a light-absorbing chalcopyrite film is difficult. Accordingly, an object of the present invention is to provide an improved process for producing a light-absorbing chalcopyrite film which process is suitable for the mass production of homogeneous and large light-absorbing plates for use in solar cells.

The above object of the present invention is accomplished with a process for producing a light-absorbing chalcopyrite film which comprises the steps of: applying at least one solution containing at least either of (a) an organic compound of a metal in Group 1B of the periodic table and (b) an organic compound of a metal in Group 3B of the periodic table on a substrate at least once to thereby form a thin film containing the organic compound (a) and the organic compound (b); heating the thin film in a reducing or inert gas atmosphere to convert the thin film into a thin metal film comprising the Group 1B metal and the Group 3B metal; and heating the thin metal film in an atmosphere containing either an element in Group 6B of the periodic table or a compound thereof to thereby convert the thin metal film into a thin chalcopyrite film.

The solution to be applied on a substrate in carrying out the process of the present invention may be a mixed solution containing both the organic compound (a) and the organic compound (b). In this case, the mixed solution is applied at least once to thereby form a thin film having a given thickness. Alternatively, two solutions respectively containing the organic compound (a) and the organic compound (b) may be used for application to a substrate. In this case, the two solutions each is applied at least once to thereby form a thin film having a desired thickness and containing the organic compounds (a) and (b) in a desired proportion.

DETAILED DESCRIPTION OF THE INVENTION

Any substrate may be used for forming a thin film in the present invention, as long as it is suitable for use in producing a light-absorbing film. For example, it may be selected from substrates of suitable structures, such as glass substrates having a transparent electrode layer or the like formed on the surface thereof.

Examples of the organic compound (a), i.e., an organic compound of a metal in Group 1B (corresponding to Group 11 of the new IUPAC designation) of the periodic table, for use in the present invention include organic oxygenic compounds such as alkoxides, enolates, and phenoxides, organic acid salts such as carboxylates and sulfonates, and complex salts of copper, silver, gold, etc. Most preferred among these are organocopper compounds. Examples of the organic compound (b), i.e., an organic compound of a metal in Group 3B (corresponding to Group 13 of the new IUPAC designation) of the periodic table, for use in the present invention include organic oxygenic compounds such as alkoxides, enolates, and phenoxides, organic acid salts such as carboxylates and sulfonates, and complex salts of aluminum, gallium, indium, thallium, etc. Preferred among these are organoindium compounds.

Any solvent may be used for preparing solutions of the organic compounds (a) and (b), as long as these organometallic compounds can dissolve therein. Examples of the solvent include monohydric alcohols such as ethanol and propanol, alkoxyalcohols such as ethoxyglycols, esters such as ethyl acetate, and ketone derivatives such as acetylacetone. Suitable solvents can be selected and used. A complexing agent such as, e.g., an amine, or the like can be used in combination with the solvents.

A solution containing an organic compound (a) of a Group 1B metal of the periodic table and a solution containing an organic compound (b) of a Group 3B metal of the periodic table may be prepared separately. These solutions are alternately applied on the same substrate and dried, and this procedure is repeated until the film being formed comes to have the desired thickness. Alternatively, a solution containing both the organic compound (a) and the organic compound (b) may be prepared; this solution is applied and dried once or repeatedly so that the film being formed comes to have the desired thickness. In either case, it is desirable to form a coating film in which the proportion of the organic compound (a) to the organic compound (b) is approximately 1/1 in terms of molar ratio between the metal elements. For applying these organic-compound solutions, dip coating or spin coating is desirably used from the standpoint of obtaining a film which is thin and defect-free and has an even thickness.

The thus-obtained thin film of organometallic compounds is heated in a heating oven filled with a reducing atmosphere, e.g., hydrogen-containing nitrogen, or with an inert gas atmosphere, e.g., nitrogen or argon, at a temperature of, e.g., from 300 to 600° C. for, e.g., from several minutes to about 2 hours to thereby pyrolyze the organometallic compounds. Thus, the thin organometallic-compound film is converted to a thin metal film consisting of the Group 1B metal and the Group 3B metal.

Subsequently, the thin metal film consisting of Group 1B and 3B metals which has been thus formed on a substrate is heated in an atmosphere containing either a Group 6B (corresponding to Group 16 of the new IUPAC designation) element or a compound thereof. This heat treatment is conducted, for example, in a sealed oven. Thus, the thin metal film is converted to a thin chalcopyrite film consisting of the Group 1B metal, the Group 3B metal, and the Group 6B element. Examples of the Group 6B element include sulfur, selenium, and tellurium. Preferred of these are sulfur and selenium. Most preferred of these is selenium.

The above step for synthesizing a thin chalcopyrite film can be accomplished, for example, by a method comprising placing a powder of, e.g., selenium metal in a vacuum heating oven or the like beforehand, introducing thereinto the substrate having formed thereon a thin alloy film consisting of Group 1B and 3B metals, evacuating the oven to vacuum, and then heating the inside of the oven to, e.g., 400 to 600° C. The light-absorbing chalcopyrite film thus obtained is preferably a ternary-alloy film in which the Group 1B metal, the Group 3B metal, and the Group 6B element are copper, indium, and selenium, respectively, and the molar ratio among these is about 1/1/2.

The present invention will be explained below in more detail by reference to the following Examples, but the invention should not be construed as being limited thereto.

EXAMPLE 1

Copper(II) acetate/indium(III) acetate mixtures having various copper/indium molar ratios ranging from 0.79 to 1.15 each was dissolved in an equimolar amount of monoethanolamine based on the total amount of the copper and the indium. Each resultant solution was diluted with isopropanol to adjust the monoethanolamine concentration to 0.5M. The diluted solutions each was applied by spin coating on a soda glass substrate having dimensions of 50 mm by 50 mm on which a thin molybdenum film about 1 $\mu$m thick had been vapor-deposited beforehand. The coated glass substrates were placed in a 100° C. drying oven for 1 hour to dry the coating films, subsequently transferred to a heating oven filled with a nitrogen atmosphere, heated therein to 300° C. over a period of 30 minutes, and then kept at that temperature for 10 minutes for pyrolysis. Thus, a thin copper-indium alloy film having a thickness of about from 0.5 to 1.1 $\mu$m was formed on each glass substrate.

The substrates each bearing a thin copper-indium alloy film were introduced into a vacuum heating oven together with a selenium powder. The heating oven was evacuated to a vacuum of $2\times10^{-5}$ Torr, and the substrates were then heated at 200° C. for 1 hour and subsequently at 550° C. for 1 hour. Thereafter, the substrates were gradually cooled to convert the copper-indium alloys to ternary alloys. Thus, thin chalcopyrite films were formed.

The thus-obtained glass substrates each bearing a thin chalcopyrite film were immersed for 5 minutes in a 70° C. ammoniacal aqueous solution containing 0.01M cadmium (II) ions. Thereafter, an aqueous solution containing 0.01M thiourea was added to the ammoniacal solution to form a 0.05 $\mu$m-thick cadmium sulfide film on each thin chalcopyrite film. A 1 $\mu$m-thick window layer comprising zinc oxide doped with aluminum was formed on each chalcopyrite film by sputtering. Thus, solar cell light-absorbing plates shown in Table 1 were obtained.

With respect to each of these light-absorbing plates, three samples produced under the same conditions were examined for photo-electric conversion efficiency using a solar cell output analyzer (manufactured by WACOM Co.), and the found values were averaged. The results obtained are shown in Table 1. The results given in Table 1 show that the photo-electric conversion efficiency was the highest when the copper/indium molar ratio was around from 0.8 to 1.0, especially in the range of from 0.85 to 0.95, and larger copper proportions resulted in reduced efficiencies. The values of element proportions given in Table 1 were determined by fluorescent X-ray spectroscopy; the found values of selenium content include the amount of selenium which had bonded to the thin molybdenum film on the substrate.

TABLE 1

| Run No. | Binary Alloy | | Ternary Alloy | | Photo-electric Conversion Efficiency (%) |
|---|---|---|---|---|---|
| | Cu/In (mol) | Thickness ($\mu$m) | Se/In+Cu (mol) | Thickness ($\mu$m) | |
| 1 | 0.79 | 0.99 | 1.57 | 2.95 | 5.9 |
| 2 | 0.85 | 0.94 | 1.51 | 2.96 | 5.9 |
| 3 | 0.92 | 1.00 | 1.46 | 3.05 | 6.9 |
| 4 | 1.07 | 0.94 | 1.54 | 3.17 | 4.0 |
| 5 | 1.15 | 0.92 | 1.49 | 3.30 | 4.6 |

EXAMPLE 2

Using the same glass substrate bearing a thin chalcopyrite film as that used for producing the solar cell light-absorbing plate of Run No. 3 in Example 1, a solar cell light-absorbing plate of Run No. 6 was produced in the same manner as in Example 1, except that a cadmium sulfide film having a thickness of 0.4 $\mu$m was formed by placing the glass substrate in a vacuum vapor deposition apparatus and vapor-depositing cadmium sulfide on the surface of the thin chalcopyrite film at a substrate temperature of 150° C. and a film-forming rate of 10 Å/sec.

The photo-electric conversion efficiency of this light-absorbing plate was determined in the same manner as in Example 1, and was found to be 6.8%.

EXAMPLE 3

Acetylacetonatocopper(II) and acetylacetonatoindium (III) were separately dissolved in an equimolar amount of monoethanolamine. The resultant solutions were diluted with 2-methoxyethanol to prepare two solutions. The same glass substrate as those used in Example 1 was spin-coated first with the solution containing acetylacetonatoindium(III) and then dried to remove the solvent. This substrate was subsequently spin-coated with the solution containing acetylacetonatocopper(II) and then dried in a 110° C. drying oven for 30 minutes. Thereafter, the coated substrate was introduced into a heating oven filled with an argon atmosphere containing about 10% carbon monoxide, and was heated therein to 450° C. over a period of 30 minutes to conduct pyrolysis and then further heated at 500° C. for 1 hour to conduct crystallization. Thus, a thin copper-indium alloy film having a copper/indium molar ratio of 0.94 and a thickness of 0.57 μm was formed on the glass substrate.

The substrate bearing a thin copper-indium alloy film was heated together with selenium in the same manner as in Example 1 to convert the copper-indium alloy to a ternary alloy. Thus, a thin chalcopyrite film having a copper/indium/selenium molar ratio of about 0.94/1.00/2.46 was formed. This film was dense and defect-free.

The thus-obtained glass substrate bearing a thin chalcopyrite film was treated in the same manner as in Example 1 to obtain a solar cell light-absorbing plate of Run No. 7. Three samples produced under the same conditions as this light-absorbing plate were examined for photo-electric conversion efficiency. As a result, the average of the found efficiency values was 9.0%.

EXAMPLE 4

Copper(II) isopropoxide and indium(III) isopropoxide were dissolved in acetylacetone to give a solution in which the copper/indium molar ratio was 0.92. Thereto was added ethylene glycol to regulate the solution viscosity. The same glass substrate as those used in Example 1 was dipped in this solution and then pulled up while being held vertical to thereby deposit a coating film on the substrate. This substrate was dried in a 100° C. drying oven for 1 hour. Thereafter, the coated substrate was introduced into a heating oven filled with a helium atmosphere containing about 1% hydrogen, and was heated to 450° C. over a period of 40 minutes to form a thin copper-indium alloy film having a thickness of about 0.03 to 0.04 μm on the glass substrate.

The thin copper-indium alloy film was repeatedly subjected to the coating and pyrolysis operations described above to thereby obtain a thin copper-indium alloy film having a copper/indium molar ratio of 0.92 and a thickness of about 1 μm. Thereafter, the substrate bearing this thin copper-indium alloy film was introduced into a heating oven filled with a hydrogen sulfide atmosphere and heated at 500° C. in a hydrogen sulfide stream for 1 hour to conduct sulfidation. Thus, a thin chalcopyrite film consisting of a ternary alloy having a copper/indium/sulfur molar ratio of about 0.94/1.00/2.66 was obtained.

The thus-obtained glass substrate bearing a thin chalcopyrite film was treated in the same manner as in Example 1 to obtain a solar cell light-absorbing plate of Run No. 8. Three samples produced under the same conditions as this light-absorbing plate were examined for photo-electric conversion efficiency. As a result, the average of the found efficiency values was 6.1%.

The process of the present invention for producing a light-absorbing chalcopyrite film has effects that solar cell light-absorbing plates which are dense, defect-free, and large and have an excellent photo-electric conversion efficiency can be mass-produced economically using a simple apparatus, and that good reproducibility is attained.

While the invention has been described in detail and with reference to specific embodiments thereof, it will be apparent to one skilled in the art that various changes and modifications can be made therein without departing from the spirit and scope thereof.

What is claimed is:

1. A process for producing a light-absorbing chalcopyrite film which comprises the steps of:

applying, by dip or spin coating, at least one solution containing at least either of (a) an organic compound of a metal in Group 1B of the periodic table and (b) an organic compound of a metal in Group 3B of the periodic table on a substrate at least once to thereby form a thin film containing the organic compound (a) and the organic compound (b);

heating the thin film in a reducing or inert gas atmosphere to convert the thin film into a thin metal film comprising the Group 1B metal and the Group 3B metal; and heating the thin metal film in an atmosphere containing either an element in Group 6B of the periodic table or a compound thereof to thereby convert the thin metal film into a thin chalcopyrite film.

2. The process for producing a light-absorbing chalcopyrite film of claim 1, wherein the solution to be applied on a substrate is a mixed solution containing both the organic compound (a) and the organic compound (b), and the solution is applied at least once to thereby form a thin film having a given thickness.

3. The process for producing a light-absorbing chalcopyrite film of claim 1, wherein the solution to be applied on a substrate is a combination of a solution containing the organic compound (a) and a solution containing the organic compound (b), and these solutions each is applied at least once to thereby form a thin film having a desired thickness.

4. The process for producing a light-absorbing chalcopyrite film of claim 1, wherein the organic compound (a) is an organic oxygenic compound of an alkoxide, enolate, or phenoxide, an organic acid salt of a carboxylate or a sulfonate, or a complex salt, of a metal in Group 1B of the periodic table.

5. The process for producing a light-absorbing chalcopyrite film of claim 1, wherein the organic compound (b) is an organic oxygenic compound of an alkoxide, an enolate, or a phenoxide, an organic acid salt of a carboxylate or a sulfonate, or a complex salt, of a metal in Group 3B of the periodic table.

6. The process for producing a light-absorbing chalcopyrite film of claim 1, wherein the organic compound (a) is a copper compound, the organic compound (b) is an indium compound, and the Group 6B element of the periodic table is selenium or sulfur.

* * * * *